(12) United States Patent
Caldwell et al.

(10) Patent No.: US 9,995,858 B2
(45) Date of Patent: Jun. 12, 2018

(54) FREQUENCY- AND AMPLITUDE-MODULATED NARROW-BAND INFRARED EMITTERS

(71) Applicant: The United States of America, as represented by the Secretary of the Navy, Washington, DC (US)

(72) Inventors: Joshua D. Caldwell, Nashville, TN (US); Virginia D. Wheeler, Alexandria, VA (US); Marc Currie, Washington, DC (US); Igor Vurgaftman, Severna Park, MD (US); Jon-paul Maria, Raleigh, NC (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days. days.

(21) Appl. No.: 15/835,513

(22) Filed: Dec. 8, 2017

(65) Prior Publication Data
US 2018/0100955 A1    Apr. 12, 2018

Related U.S. Application Data

(63) Continuation of application No. 15/794,207, filed on Oct. 26, 2017, which is a continuation-in-part of (Continued)

(51) Int. Cl.
*H01L 49/00* (2006.01)
*G02B 5/00* (2006.01)
*H01L 49/02* (2006.01)

(52) U.S. Cl.
CPC .............. *G02B 5/008* (2013.01); *H01L 28/24* (2013.01); *H01L 49/00* (2013.01)

(58) Field of Classification Search
CPC .......... G02B 5/008; H01L 28/24; H01L 49/00
(Continued)

(56) References Cited

U.S. PATENT DOCUMENTS 5,091,983 A * 2/1992 Lukosz ................. G01D 5/266
250/231.19
6,297,511 B1 * 10/2001 Syllaios .................... F41J 2/02
250/493.1
(Continued)

OTHER PUBLICATIONS

Joshua D. Caldwell, Lucas Lindsay, Vincenzo Giannini, Igor Vurgaftman, Thomas L. Reinecke, Stefan A. Maier and Orest J. Glembocki, "Low-loss, infrared and terahertz nanophotonics using surface phonon polaritons," Nanophotonics 2015; 4: 44-68
(Continued)

*Primary Examiner* — Michael Maskell
(74) *Attorney, Agent, or Firm* — US Naval Research Laboratory; Joslyn Barritt

(57) ABSTRACT

IR emission devices comprising an array of polaritonic IR emitters arranged on a substrate, where the emitters are coupled to a heater configured to provide heat to one or more of the emitters. When the emitters are heated, they produce an infrared emission that can be polarized and whose spectral emission range, emission wavelength, and/or emission linewidth can be tuned by the polaritonic material used to form the elements of the array and/or by the size and/or shape of the emitters. The IR emission can be modulated by the induction of a strain into a ferroelectric, a change in the crystalline phase of a phase change material and/or by quickly applying and dissipating heat applied to the polaritonic nanostructure. The IR emission can be designed to be hidden in the thermal background so that it can be observed only under the appropriate filtering and/or demodulation conditions.

28 Claims, 10 Drawing Sheets

Related U.S. Application Data application No. 15/417,252, filed on Jan. 27, 2017, now Pat. No. 9,870,839.

(60) Provisional application No. 62/288,598, filed on Jan. 29, 2016.

(58) Field of Classification Search
USPC .......................................... 250/493.1, 504 R
See application file for complete search history.

(56) References Cited

U.S. PATENT DOCUMENTS

| | | | | |
|---|---|---|---|---|
| 9,195,052 | B2 | 11/2015 | Long et al. | |
| 9,244,268 | B2 | 1/2016 | Long et al. | |
| 9,274,352 | B2 | 3/2016 | Long et al. | |
| 2012/0235067 | A1* | 9/2012 | Araci | B82Y 20/00 250/504 R |
| 2012/0267532 | A1* | 10/2012 | Udrea | H05B 3/267 250/338.5 |
| 2014/0091208 | A1* | 4/2014 | Kai | G01N 21/27 250/214 C |
| 2014/0224989 | A1* | 8/2014 | Long | G02F 1/0126 250/338.4 |
| 2014/0291704 | A1 | 10/2014 | Ali et al. | |
| 2015/0063739 | A1* | 3/2015 | Long | G02F 1/0126 385/1 |
| 2015/0293428 | A1 | 10/2015 | Ben-Abdallah et al. | |
| 2016/0013409 | A1* | 1/2016 | Burenkov | H01L 49/006 250/504 R |
| 2016/0103341 | A1* | 4/2016 | Long | G02F 1/0126 359/244 |

OTHER PUBLICATIONS

Joshua D. Caldwell, Orest J. Glembocki, Yan Francescato, Nicholas Sharac, Vincenzo Giannini, Francisco J. Bezares, James P. Long, Jeffrey C. Owrutsky, Igor Vurgaftman, Joseph G. Tischler, Virginia D. Wheeler, Nabil D. Bassim, Loretta M. Shirey, Richard Kasica, and Stefan A Maier, "Low-Loss, Extreme Subdiffraction Photon Confinement via Silicon Carbide Localized Surface Phonon Polariton Resonators," Nano Lett. 2013, 13, 3690-3697.

Joshua D. Caldwell, Andrey V. Kretinin, Yiguo Chen, Vincenzo Giannini, Michael M. Fogler, Yan Francescato, Chase T. Ellis, Joseph G. Tischler, Colin R. Woods, Alexander J. Giles, Minghui Hong, Kenji Watanabe, Takashi Taniguchi, Stefan A. Maier, and Kostya S. Novoselov, "Sub-diffractional volume-confined polaritons in the natural hyperbolic material hexagonal boron nitride," Nature Communications (2014) 5:5221.

Jean-Jacques Greffet, Remi Carminati, Karl Joulain, Jean-Phillipe Mulet, Stéphane Mainguy, and Yong Chen, "Coherent emission of light by thermal sources," Nature 2002, 416, 61-64.

Jon A. Schuller, Thomas Taubner, and Mark L. Brongersma, "Optical antenna thermal emitters," Nature Photonics, vol. 3 (Nov. 2009), pp. 658-661.

E. Sachet, C.T. Shelton, J.S. Harris, B.E. Gaddy, D.L. Irving, S. Curarolo, B.F. Donovan, P.E. Hopkins, P.A. Sharma, A.L. Sharma, J.F. Ihlefeld, S. Franzen, and J.-P. Maria, "Dysprosium-doped cadmium oxide as a gateway material for mid-infrared plasmonics" Nature Materials 14, 414-420 (2015).

Gururaj V. Naik, Vladimir M. Shalaev, and Alexandra Boltasseva, "Alternative Plasmonic Materials: Beyond Gold and Silver," Adv. Mater. 2013, 25, 3264-3294.

PCT Search Report and Written Opinion dated Apr. 18, 2017 in corresponding International Application No. PCT/US2017/015209.

* cited by examiner

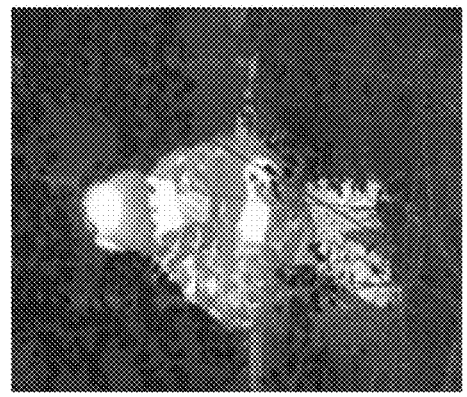
FIG. 1A
(Prior Art)
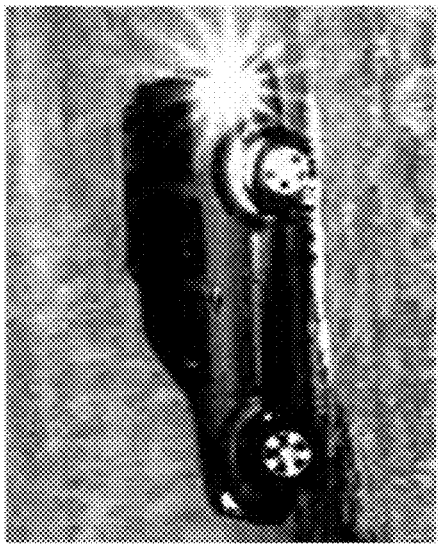
FIG. 1B
(Prior Art)

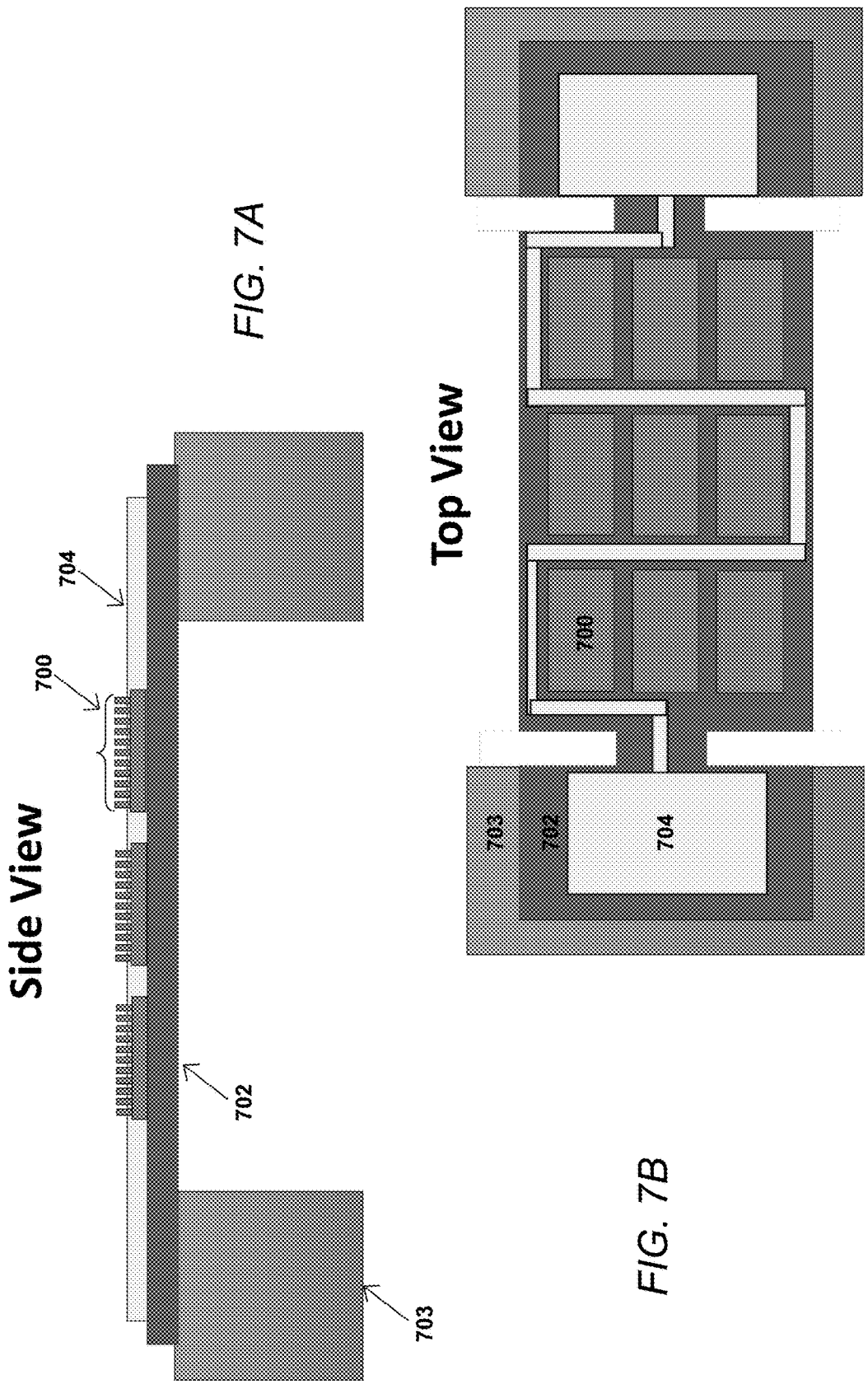

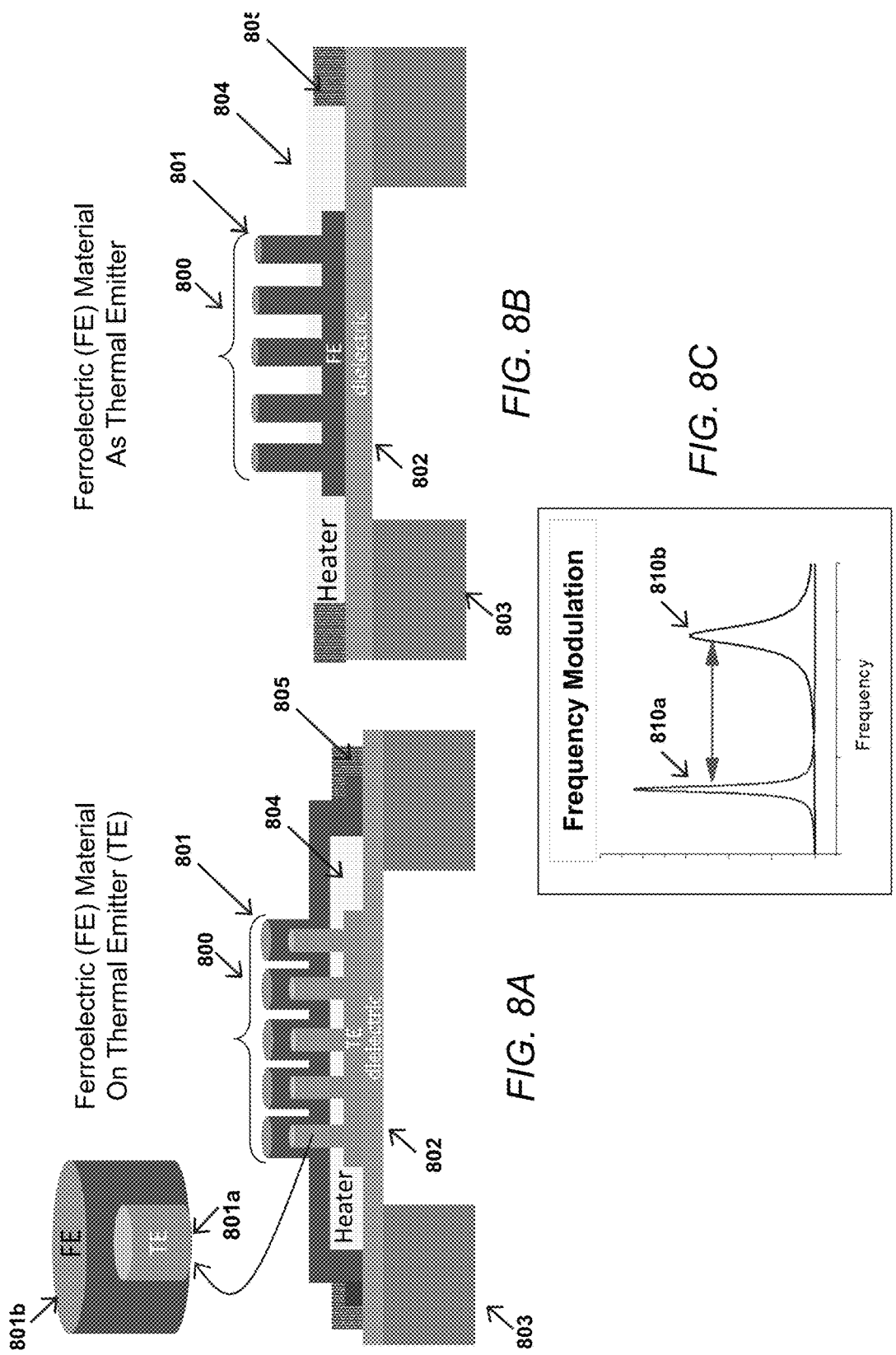

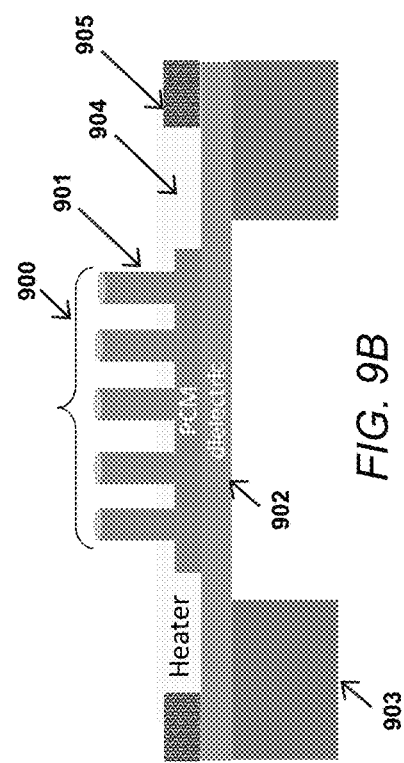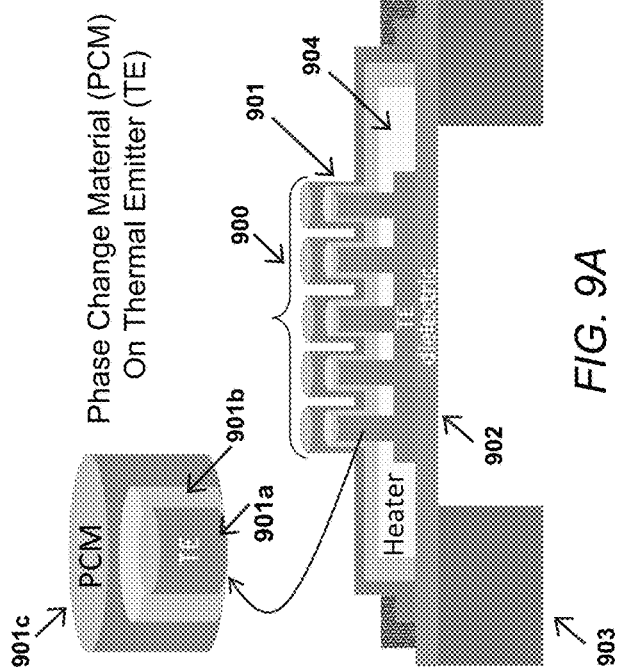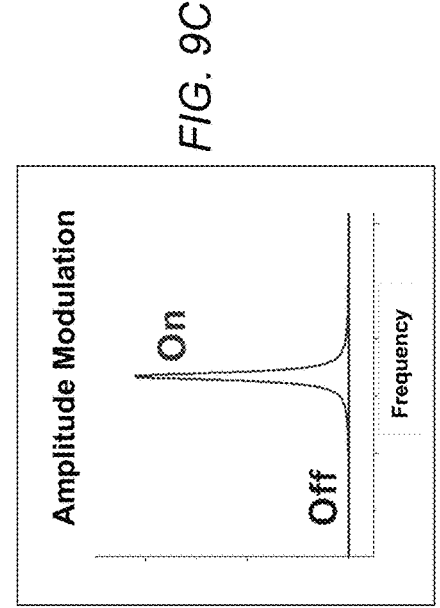

FREQUENCY- AND AMPLITUDE-MODULATED NARROW-BAND INFRARED EMITTERS

CROSS-REFERENCE

This Application is a Continuation of, and claims the benefit of priority under 35 U.S.C. § 120 based on, U.S. patent application Ser. No. 15/794,207 filed on Oct. 26, 2017, which is a Continuation-in-Part of, and claims the benefit of priority under 35 U.S.C. § 120 based on, U.S. patent application Ser. No. 15/417,252 filed on Jan. 27, 2017, which is a Nonprovisional of, and claims the benefit of priority under 35 U.S.C. § 119 based on, U.S. Provisional Patent Application No. 62/288,598 filed on Jan. 29, 2016. The prior applications and all references cited herein are hereby incorporated by reference into the present disclosure in their entirety.

TECHNICAL FIELD

The present invention relates to imaging, sensing and optical source technologies based on infrared (IR) emitters, specifically IR emitters fabricated from polaritonic material structures.

BACKGROUND

Infrared (IR) signaling with the aid of night vision and/or thermal imaging technology for detection has provided a means towards relatively covert free-space signaling and communications applications. In addition, IR signaling can serve as a means of free-space communications within the various atmospheric windows, and can denote a change in sensor status (e.g. the detection of chemical agent).

However, current approaches use either high-power IR lasers (FIG. 1A) or spectrally broad, highly diffuse emitters (FIG. 1B). As can be seen from FIG. 1A, in the case of high-power IR lasers, the high power of the laser produces a high-visibility signal under the appropriate imaging conditions; however such laser-based sources tend to be highly directional, such that outside of a narrow cone of angles between the detector and the source, an optical signal from such a high-power laser will not be readily observed. The high output power can also cause a "halo" effect whereby the detected signal saturates multiple pixels washing out part of the image. In addition, such systems have a large power requirement that limits battery life, making them unsuitable for many field uses.

In the case of diffuse emitters as shown in FIG. 1B, the source may be observed over a broader range of angles; however, this comes at the cost of being spectrally broad and weak in amplitude, making their observation outside of close ranges difficult. In addition, because they are spectrally broad, such emitters may clearly advertise the location of the source, since they may be observable not only to authorized observers having thermal imagers in a specified wavelength range, e.g., 3 μm thermal imagers, but also to anyone having conventional near-IR night vision goggles. Thus, these sources are very easy to replicate and intercept.

Thus, despite substantial advancements in technology, significant issues with these applications persist. To ameliorate these issues, new technological approaches are required.

Polar dielectric crystals experience an imbalance of the partial ionic charges of the atomic species in the crystal. For example, in the exemplary silicon carbide polar dielectric illustrated by the block diagram in FIG. 2A, a charge imbalance exists between the partial positive charge "δ+" of the Si ions in the lattice and the partial negative charge "δ−" of the C ions. The presence of this partial ionic charge imbalance enables stimulation of surface phonon polaritons (SPhPs) in such polar dielectric materials. In addition, the sub-diffractional confinement of light can be observed using metallic and highly doped semiconductor species (including many of the polar dielectric SPhP crystals when a high density of free carriers are present), providing similar behavior in the higher frequency regimes. In these cases, the incident light couples to free electrons or holes ("carriers") in the material in a manner illustrated by the block schematic in FIG. 2B, providing the mechanism for the sub-diffractional confinement of light.

Incident light at wavelengths corresponding to frequencies ω between the frequency $\omega_{TO}$ of the transverse optic (TO) and the frequency $\omega_{LO}$ of the longitudinal optic (LO) phonons of a polar dielectric material, e.g., as shown by 4H—SiC Raman spectrum curve 301 shown in FIG. 3A, induces coherent oscillations of the crystal lattice of the material. Because of the presence of the positive and negative atomic charges δ+ and δ−, these oscillations induce a large surface electromagnetic field that causes a normally transparent dielectric to become highly reflective within this spectral band, referred to as the "Reststrahlen" band, as seen by dashed IR reflectance curve 302 for 4H—SiC shown in FIG. 3A (and also shown in FIG. 3B). See Joshua D. Caldwell, Lucas Lindsay, Vincenzo Giannini, Igor Vurgaftman, Thomas L. Reinecke, Stefan A. Maier and Orest J. Glembocki, "Low-loss, infrared and terahertz nanophotonics using surface phonon polaritons," *Nanophotonics* 2015; 4: 44-68. Correspondingly, the real part of the dielectric function (permittivity) becomes negative, as shown by solid curve 303 shown in FIG. 3B, which enables the confinement of resonant light within sub-diffractional volumes through the nanostructuring of these polar dielectrics or at interfaces and surfaces of such materials.

A plot illustrating the wide range of surface plasmon (NIR to MWIR) and surface phonon (MWIR to FIR) polariton materials, often referred to collectively as "polaritonic" materials, is provided in FIG. 4, with standard plasmonic metals (e.g. silver, gold, aluminum and copper) that support surface plasmons in the ultraviolet and visible and other more exotic types of polaritons (e.g. exciton polaritons) being omitted for simplicity; however, one skilled in the art will readily recognize that the materials shown in FIG. 4 are merely exemplary and by no means constitute an exhaustive and complete list of available polaritonic materials.

It was recently demonstrated by researchers that the Naval Research Laboratory (NRL) that nanoscale structures fabricated out of silicon carbide (SiC) and hexagonal boron nitride (hBN) result in spectrally narrow resonances within the mid-infrared (10.3-12.5 um for SiC; 6.2-7.3 um and 12.1-13.2 um for hBN), with resonance linewidths as narrow as 3 $cm^{-1}$, on par with well-defined crystal vibrations. See Joshua D. Caldwell, Orest J. Glembocki, Yan Francescato, Nicholas Sharac, Vincenzo Giannini, Francisco J. Bezares, James P. Long, Jeffrey C. Owrutsky, Igor Vurgaftman, Joseph G. Tischler, Virginia D. Wheeler, Nabil D. Bassim, Loretta M. Shirey, Richard Kasica, and Stefan A Maier, "Low-Loss, Extreme Subdiffraction Photon Confinement via Silicon Carbide Localized Surface Phonon Polariton Resonators," *Nano Lett.* 2013, 13, 3690-3697 (SiC); and Joshua D. Caldwell, Andrey V. Kretinin, Yiguo Chen, Vincenzo Giannini, Michael M. Fogler, Yan Francescato, Chase T. Ellis, Joseph G. Tischler, Colin R. Woods, Alexander J. Giles, Minghui Hong, Kenji Watanabe, Takashi Taniguchi, Stefan A. Maier, and Kostya S. Novoselov, "Sub-diffractional volume-confined polaritons in the natural hyperbolic material hexagonal boron nitride," *NATURE COMMUNICATIONS* (2014) 5:5221 (hBN). See also U.S. Pat. No. 9,195,052 to Long et al, entitled "Actively Tunable Polar-Dielectric Optical Devices" (Nov. 24, 2015); U.S. Pat. No. 9,244,268 to Long et al., entitled "Actively Tunable Polar-Dielectric Optical Devices" (Jan. 26, 2016); U.S. Pat. No. 9,274,532 to Long et al., entitled "Actively Tunable Polar-Dielectric Optical Devices" (Mar. 1, 2016); and U.S. Patent Application Publication No. 2016/0103341 by Long et al.

These nano-scale polaritonic structures, such as the SiC bowtie antenna arrays whose reflectances are illustrated by the plots shown in FIG. 5A, can provide passive polarization- and frequency-selective infrared reflection spectra due to the sub-diffractional resonance modes supported within the nano-scaled structures. In addition, the IR emission spectra of such SiC bowtie antenna arrays at T=350° C. shown in FIG. 5B demonstrate that by heating the structures to modest temperatures, tailored IR emission can be produced, with the emission retaining the polarization and narrow spectral bandwidth of the resonances observed in the reflection spectra shown in FIG. 5A. It has been observed within our lab that heating even to small temperatures such as 50° C. is sufficient to induce a measurable emission.

This phenomenon was originally demonstrated for SiC micron-scale gratings and microwires. See Jean-Jacques Greffet, Rémi Carminati, Karl Joulain, Jean-Phillipe Mulet, Stéphane Mainguy, and Yong Chen, "Coherent emission of light by thermal sources," *Nature* 2002, 416, 61-64; and Jon A. Schuller, Thomas Taubner, and Mark L. Brongersma, "Optical antenna thermal emitters," *NATURE PHOTONICS*, Vol. 3 (November 2009), pp. 658-661. If a device comprising a plurality of nano-scale emitters is fabricated on a substrate homogeneous with the nano-scale emitters (e.g. SiC bowties on a SiC substrate), the IR emission from the nano-scale emitters will be superimposed upon the broadband high reflectivity (low emission) of the underlying substrate, providing a large optical contrast. On the other hand, if the nano-scale structures are fabricated (or grown) on a dissimilar substrate material, the IR emission from those structures will be superimposed upon the IR emission of the underlying substrate and will result in a broad gray-body radiation spectrum with the narrow-band IR emission signature from the nano-scale structures superimposed thereon.

While the IR emission from localized SPhP resonators discussed in the literature has primarily focused on SiC structures, see Greffet, supra, and Schuller, supra, in principle, any polar dielectric crystal can be used, provided the Reststrahlen band is in an appropriate frequency range for IR emission at the temperature of operation. This is equally applicable to surface plasmon polaritons. In the case of the latter, such materials will operate over a broader spectral range, but the resonance linewidths will be significantly broadened with respect to the lower-frequency SPhP materials.

Although use of most plasmonic metals (e.g. gold and silver) would be cost-prohibitive and would require excessive temperatures, even in excess of their melting points, to achieve emission near their resonances in the visible spectral region, a significant effort has also been focused on developing alternative lower-loss plasmonic materials. For instance, developments from Prof. Jon-Paul Maria's group at North Carolina State University have led to a low-loss plasmonic material in the form of dysprosium-doped cadmium oxide that would offer the potential for IR emitters in the 2-8 µm range. See E. Sachet, C. T. Shelton, J. S. Harris, B. E. Gaddy, D. L. Irving, S. Curarolo, B. F. Donovan, P. E. Hopkins, P. A. Sharma, A. L. Sharma, J. F. Ihlefeld, S. Franzen, and J.-P. Maria, "Dysprosium-doped cadmium oxide as a gateway material for mid-infrared plasmonics" *Nature Materials* 14, 414-420 (2015).

Additional materials such as transparent conducting oxides would provide opportunities in the 1-5 um region. See Gururaj V. Naik, Vladimir M. Shalaev, and Alexandra Boltasseva, "Alternative Plasmonic Materials: Beyond Gold and Silver," *Adv. Mater.* 2013, 25, 3264-3294. While the optical losses (efficiency) of these plasmonic materials is higher than in their phonon polariton counterparts, which will result in broader emission linewidths, they do offer the potential for tailored IR emitters in a spectral range where currently no known phonon polaritons exist ($\lambda<6$ µm). As noted above, a wide array of these polaritonic materials is presented in FIG. 4. It should be noted that all of those presented are in various states of commercial maturity, but successful synthesis of all has been demonstrated. Further, it should be stated that this list is not meant to be exhaustive, but that this approach is equally applicable to tailored IR emitters of all kinds, for instance SPhP, surface plasmon and dielectric resonators.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention utilizes the properties of polaritonic materials to provide IR emission devices that can be frequency- and/or amplitude-modulated to provide spectral, temporal and spatial patterns that can be recognized only under the appropriate filtering and/or demodulation conditions.

The IR emission devices comprise one or more arrays of fabricated polaritonic infrared emitters arranged on a substrate, where the arrays of emitters are coupled to a heater configured to provide heat to one or more of the emitter arrays in the device. When the fabricated infrared emitters are heated, they produce an infrared emission that can be polarized and whose spectral emission range, emission wavelength, and/or emission linewidth can be tuned by the material used to form the elements of the array and/or by the size and/or shape of the emitters.

In some embodiments, the nanoscale emitters are formed from or are coated with a ferroelectric polaritonic material which is used to modulate the frequency response of the polaritonic IR emitters through the application of a piezoelectric strain that changes the material's polarization state and can be induced by the application of an external bias.

In other embodiments, the polaritonic IR emitters are formed from or are coated with a phase change material such as vanadium dioxide ($VO_2$), vanadium pentoxide ($V_2O_5$), germanium-antimony-tellurium (GeSbTe), or tungsten trioxide ($WO_3$), which can change the infrared reflection of the emitters by the application of a thermal, electrical, or optical pulse which changes the material from a "metallic" to a "dielectric" state, thereby enabling the amplitude of the emission from the IR emitters to be modulated.

In other embodiments, the polaritonic IR emitters are coated with a thermal dissipation layer such as nanodiamond. Such materials can serve to conduct the heat rapidly away from the emitting material, therefore "shutting off" the IR emission or spectrally tuning the emission energy.

In some embodiments, the heater can be in the form of boron-doped diamond. In other embodiments, the heater can be in the form of thin layer of a doped semiconductor that is optically transparent in the infrared (IR) wavelength range (about 700 nm to about 1 mm), such as GaN, InN, indium tin oxide (ITO), or ZnO, while in other embodiments, the heater can be a layer of a conductive metal such as $Nb_2N$, TiN, or $Ta_2N$, where the metal layer has a thickness less than that of the optical absorption depth of the material. The material comprising the heater can be grown epitaxially on a substrate or can be deposited on a substrate, e.g., via atomic-layer deposition.

BRIEF DESCRIPTION OF THE DRAWINGS

FIGS. 1A and 1B illustrate aspects of exemplary thermal signaling devices according to the prior art.

FIGS. 7A and 7B are block schematics illustrating a side view (FIG. 7A) and a top view (FIG. 7B) of an IR emitter comprising one or more nano-scale structure arrays in accordance with the present disclosure.

FIGS. 8A-8C illustrate aspects of a polaritonic IR emitter incorporating ferroelectric materials into one or more nano-scale structure arrays in accordance with the present disclosure.

FIGS. 9A-9D illustrate aspects of a polaritonic IR emitter incorporating phase change materials into one or more nano-scale structure arrays in accordance with the present disclosure.

DETAILED DESCRIPTION

Figure 2B:
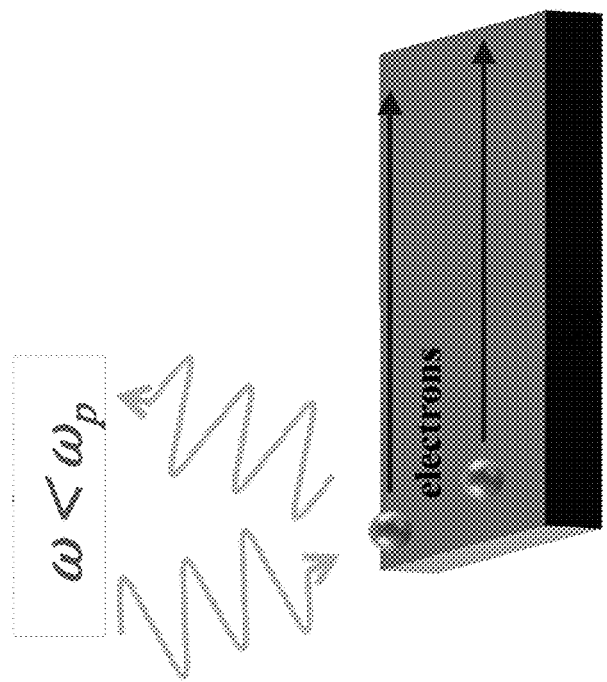
FIGS. 2A and 2B are schematics illustrating aspects of the behavior of polar dielectric materials used in an IR emitter in accordance with the present disclosure.
Figure 2A:
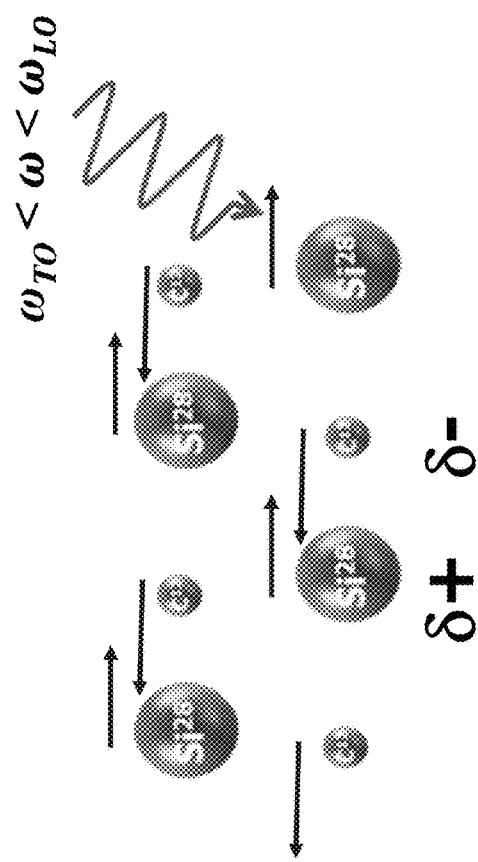
Figure 3B:
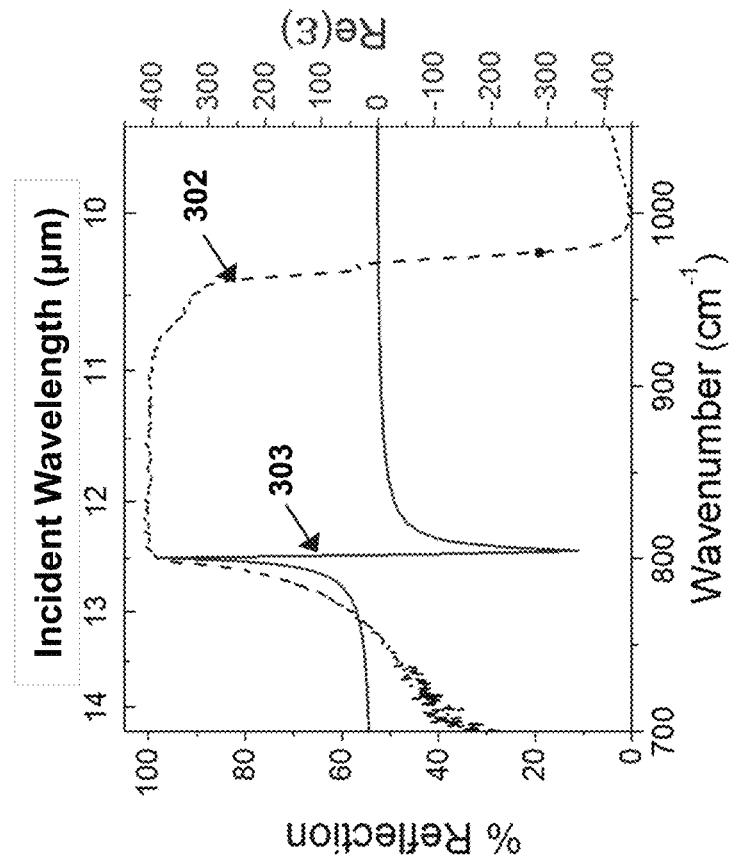
FIGS. 3A and 3B are plots illustrating additional aspects of the behavior of polar dielectric materials used in an IR emitter in accordance with the present disclosure.
Figure 3A:
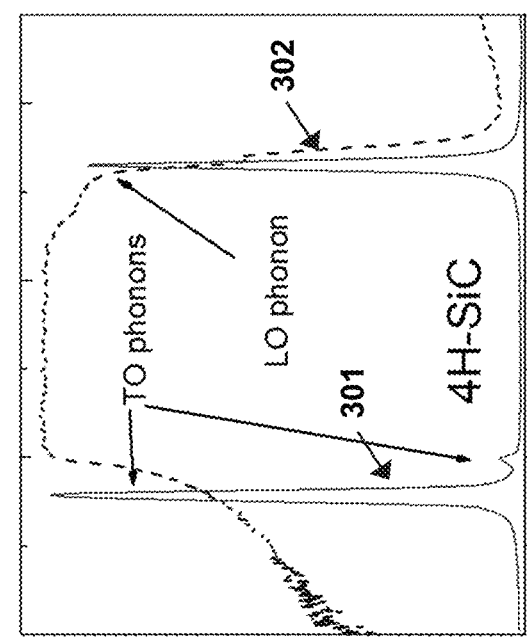

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention utilizes the properties of polaritonic materials to provide IR emission devices that can be frequency- and/or amplitude-modulated to provide spectral, temporal and spatial patterns that can be easily recognized under the appropriate filtering and/or demodulation conditions.

Aspects of the means by which the infrared emission signals can be imaged or detected for potential applications will be described below in the context of the FIGURES, which form a part of the disclosure of the present invention. It will be noted that in the FIGURES and in the description herein, where a structural element appears in more than one FIGURE, those elements are denoted by the same reference numeral, with only the first digit being changed to reflect the FIGURE in which they are shown. For example, IR emitter array 700 shown in FIGS. 7A/7B corresponds to IR emitter array 800 shown in FIGS. 8A/8B, IR emitter array 900 shown in FIGS. 9A/9B, and IR emitter array 1100 shown in FIG. 11.

As noted above, if a device comprising an array of polaritonic nano-scale structures is fabricated on a substrate homogeneous with the nano-scale structures (e.g. SiC bowties on a SiC substrate), the nanostructure's IR emission will be superimposed upon the broadband high reflectivity (low emission) of the underlying substrate, providing a high optical contrast, whereas if the nano-scale structures are fabricated (or grown) on a dissimilar substrate material, the IR emission from those nano-scale structures will be superimposed upon the IR emission of the underlying substrate and will result in a broad gray-body radiation spectrum with the narrow-band IR emission signature from the nano-scale structures superimposed thereon.

This difference in the IR emission of a such a device, depending on the substrate on which it is formed, provides a great deal of flexibility in the design of such IR emission devices, enabling a device to be designed to hide the presence of the signal in a broadband infrared source, to provide a high degree of contrast relative to the background substrate, or to provide a signal that can only be observed if the nanostructured device is illuminated by an external source having a certain frequency or at high temperatures by an IR imager configured to detect certain frequencies. In addition, the material and structure of the device can be tuned to provide more or less thermal contrast vis a vis the substrate, thereby permitting the device to be more or less visible as desired.

Figure 6A:
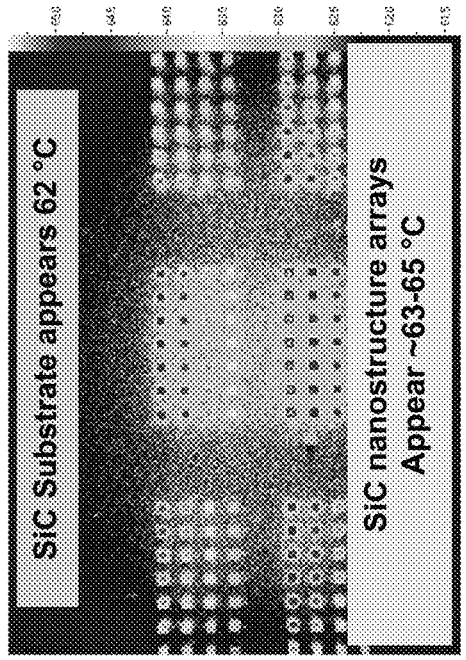
FIGS. 6A-6D illustrate the aspects of the apparent vs. measured temperatures of SiC slabs (FIGS. 6A and 6C) and nano-scale emitter arrays (FIGS. 6B and 6D).

FIGS. 6A/6B and 6C/6D illustrate the way in which an array of nano-scale polaritonic IR emitters can be used to produce a desired thermal image.

FIG. 6A depicts thermal images of a metal chuck and a SiC substrate that have a measured temperature (as measured by, e.g., a thermocouple) of 75° C., and shows that the metal chuck has a thermally imaged "apparent" temperature of 76° C., while the SiC substrate—while having the same measured temperature as the chuck—appears to be much cooler, with an apparent temperature of 66° C.; FIG. 6C shows a similar difference in apparent temperatures of a metal chuck and a SiC substrate both having a measured temperature of 120° C., with the metal chuck having an apparent temperature of 121° C. and the SiC substrate exhibiting a much cooler apparent temperature of 103° C.

Figure 6B:
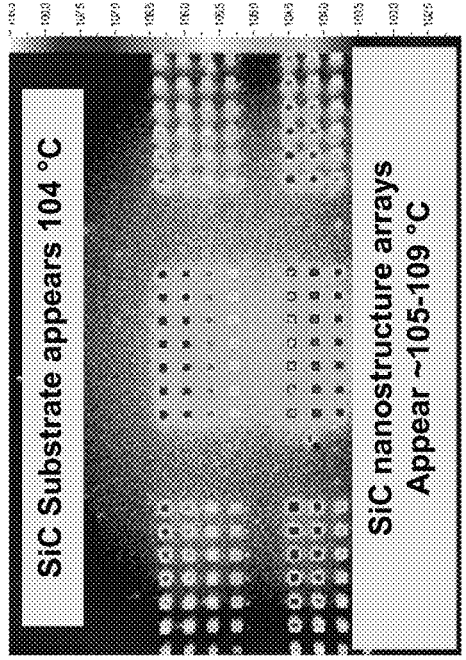
Figure 6C:
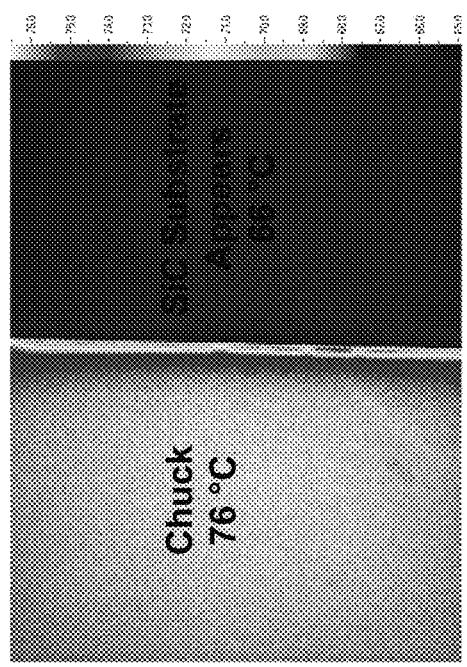
Figure 6D:
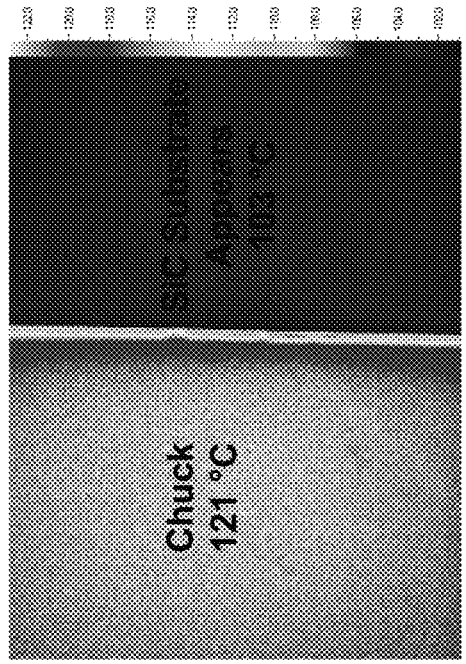

In addition, as shown in FIGS. 6B and 6D, SiC in the form of one or more arrays of nano-scale IR emitters can appear "warmer" to a thermal imager than the solid slab of SiC used as a substrate for the array, where all of which exhibit apparent temperatures that are cooler than the measured temperature, but range in actual apparent temperatures with variations due to spectral shifts in the SPhP resonance frequencies. Thus, as shown in FIG. 6B, a SiC nano-scale structure array having a measured temperature of 75° C. has an apparent temperature in the range of about 63 to about 65° C., while a SiC nano-scale structure array having a measured temperature of 120° C. (FIG. 6D) has an apparent temperature in the range of about 105 to about 109° C. This difference between the measured and apparent temperatures occurs due to the method by which a thermal camera is calibrated. Because a thermal camera determines the apparent temperature based on the total integrated intensity collected over a spectral bandwidth of the camera and assumes it to be a gray-body, mirrors, which do not emit, can appear much cooler than their actual measured temperature. By making appropriately designed SPhP or SPP nano-scaled structures, one can tailor the apparent temperature of an object without changing its true measured temperature.

As described in more detail below, in accordance with the present invention, the present invention takes advantage of these thermal properties of polaritonic materials to provide an IR emission device comprising arrays of fabricated IR emitters formed from polaritonic materials that exhibit phonon or plasmon polariton resonances when they are heated above room temperature and/or are illuminated by light having wavelengths within their Reststrahlen band, where the devices can be modified to provide a desired thermal response. In many embodiments, the polaritonic IR emitters in devices in accordance with the present invention will be in the form of nanoscale emitters such as polaritonic nanoantennas and often will be referred to as such in the description below, but one skilled in the art will readily recognize that other configurations of the polaritonic emitters such as one- or two-dimensional gratings, meshes, etc., can also be used, and all such emitter configurations are deemed to be within the scope of the present disclosure.

FIGS. 7A and 7B provide a side and a top view, respectively, of an exemplary general configuration of an IR emission device in accordance with one or more aspects of the present invention.

Thus, as can be seen from FIGS. 7A and 7B, an IR emission device in accordance with the present invention comprises one or more arrays 700 of nanoscale polaritonic IR emitters arranged on a substrate 703, with an intermediate dielectric membrane 702 disposed between the substrate 703 and the emitter array to provide mechanical stability and thermal isolation to the heated nanoscale IR emitter arrays to reduce power consumption.

The arrays of IR emitters are coupled to a heater 704 that is configured to provide heat to one or more of the emitter arrays in the device. Boron-doped nanocrystalline diamond is especially suited for use as a heater in an IR emission device in accordance with the present invention because it is optically transparent and will not interfere with the thermal signal from SiC; however, one skilled in the art will recognize that other materials and/or heating systems (e.g. serpentine metal resistive heaters) can be used as appropriate. For example, in some embodiments, the heater can be in the form of thin layer of a doped semiconductor that is optically transparent in the infrared (IR) wavelength range (about 700 nm to about 1 mm), such as GaN, InN, indium tin oxide (ITO), or ZnO, or can be a layer of a conductive metal such as $Nb_2N$, TiN, or $Ta_2N$, where the metal layer has a thickness less than that of the optical absorption depth of the material. The material comprising the heater can be grown epitaxially on a substrate or can be deposited on a substrate, e.g., via atomic-layer deposition, and typically will have a thickness of less than 100 nm. While omitted from the FIGURE for simplicity, electrical contacts connected to the heater material can be utilized to drive a current through the heater.

As described above, when the nanoscale IR emitters are heated by heater 704, they produce an IR emission that can be polarized using careful design of the IR emitter structure. In addition, in accordance with the present invention, the spectral emission range, emission wavelength, and/or emission linewidth of the IR emission can be tuned by varying the any one or more of the polaritonic material used, the size of the emitters, and/or their shape. In some cases the IR emission of the emitters can be tuned so as to cause the array of emitters to have a different "perceived" temperature than that of the underlying substrate.

Thus, in accordance with the present invention, by tailoring the characteristics of the device, an IR emission device formed from such a polaritonic material nano-scale structure array can be tailored to provide a desired IR emission response. For example, by selecting an appropriate material for the substrate and/or the IR emitters, the IR emission from the device can cause the device to have a desired IR emission spectrum that can be used as a tailored optical source or beacon or can be used to modify the perceived temperature of the device in a manner as described above. In some embodiments, the device can be designed to be "hidden" from view unless the device is illuminated by light having an appropriate frequency, e.g., a frequency spectrally close to the resonance of the nanoscale IR emitters. In other embodiments, a heater can be configured to apply heat to selected IR emitter arrays or to produce variations in the actual temperatures applied to different IR emitter arrays on the same device, thereby producing a spatially patterned IR emission signature that can identify a source of the IR emitters.

It will be noted here that one skilled in the art will recognize that the device design illustrated in FIGS. 7A/7B is merely exemplary, and other designs can be used in implementing the key features of the invention, i.e., the use of nano-scale structures of nanophotonic and photonic materials for tailored narrow-band and polarized IR emitters which can provide a source of IR emission for a wide range of applications and the use of various mechanisms by which the IR emission from the emitters can be frequency- or amplitude-modulated over a wide range of modulation frequencies and modulation depths. In addition, while these features are described primarily in the context of IR emitters that are heated to provide an IR emission, one skilled in the art will recognize that in many cases one or more of these features can also be used to provide modulated absorption/reflection/transmission from similar devices at ambient temperatures.

One way in which the IR emitters in a device in accordance with the present invention can be tuned and/or modulated is through the use of specific kinds of emitter materials or coatings on the emitters. Thus, the polaritonic resonances can be tuned by using ferroelectric materials (e.g. lead zirconate titanate), phase change materials (e.g., vanadium pentoxide or germanium telluride), and/or fast thermal dissipation materials (e.g. nanodiamond or boron arsenide) to induce fast changes in the amplitude or free-space wavelength of the resonances.

As discussed above, any change in the amplitude or wavelength corresponding to the resonance frequency will result in a commensurate change in the IR emission spectrum. As described below, in many cases, these ferroelectric, phase change, or fast thermal dissipation materials can be used as a coating for multi-layered IR emitters formed from polaritonic materials. However, many of these phase change and ferro/piezoelectric materials are also semiconductors and/or polar dielectric materials in their own right and so in some embodiments can be used in devices where a single material provides both the plasmonic/SPhP-based IR emitter/sensor and the material for transduction, simultaneously. While we mention only single-material or bi-material iterations of this invention, it should be noted that one skilled in the art will also recognize that more complicated multilayered and/or metamaterial-based structures with various polaritonic, ferroelectric, phase change, and/or fast-thermal dissipation materials to achieve these aims within a user-defined frequency range are also within the scope of this patent.

FIGS. 8A-8C illustrate aspects of an exemplary embodiment of an IR emission device in accordance with the present invention in which ferroelectric materials are used to obtain a frequency-modulated thermal response of the polaritonic IR emitters.

As with the embodiment illustrated in FIGS. 7A and 7B described above, in the exemplary embodiment illustrated in FIGS. 8A and 8B, an IR emission device in accordance with the present invention includes an array 800 of nanoscale polaritonic IR, or thermal, emitters (labeled as "TE" in the FIGURE) arranged on a silicon substrate 803, with an intermediate dielectric membrane 802 disposed between the substrate 803 and the emitter array 800.

In the embodiment illustrated in FIG. 8A, each of the individual polaritonic IR emitters 801 in the array 800 comprises an IR emitter core 801a formed from a polaritonic material such as silicon carbide (SiC) that is coated with an outer layer 801b of a ferroelectric (FE) material such as aluminum nitride (AlN) or barium strontium titanate (BST).

In some cases, e.g., AlN or BST, the ferroelectric material is also a polar dielectric capable of supporting phonon polaritons, so that in some embodiments, as shown in FIG. 8B, the ferroelectric material is used to form the IR emitters 801 themselves rather than simply be used as a coating. In some embodiments, all of the emitters are coated with or formed from the same ferroelectric material, while in other embodiments, a subset of the emitters can be coated with or formed from a different ferroelectric material so as to produce a spatially varying strain, and thus a spatially varying IR emission pattern, e.g., one that can identify the owner of the IR emitters to a reader of the thermal signal. In still other embodiments, one or more of the emitters can be formed from a ferroelectric material core with a coating of a phase change material; while in other embodiments, one or more of the emitters can be formed from a phase change material core with a coating of a ferroelectric material.

Whether coated with a ferroelectric material or formed from one, the emitters 801 are coupled to a heater 804 that is configured to provide heat to one or more of the emitters in the array so as to produce an IR emission in a manner described above, where the IR emission can serve as a narrow-band infrared optical source or beacon or that may cause the heated array of emitters to have a different "perceived" temperature than that of the underlying substrate and/or surrounding environment.

In addition, in this embodiment of an IR emitter in accordance with the present invention, the emitters are coupled to electrical contacts 805 and a voltage source which can apply a bias across the ferroelectric material. The ideal configuration of the contacts will be dictated by the IR emitter design and the orientation of the ferroelectric crystal planes in the device. The voltage source can be any suitable source capable of applying a bias to the device, e.g., a battery or other power pack.

When a voltage pulse is applied to the coated or solid ferroelectric IR emitters 801, the voltage reorients the spontaneous polarization of the ferroelectric material, thereby inducing a strain in the ferroelectric coating or emitter material. This change in strain modifies the frequency or frequencies of the optical phonons of the polar dielectric material forming the IR emitters, thus modifying the spectral frequency of their sub-diffractional resonances.

Thus, in accordance with the present invention, the output frequency of the IR emitters as well as their "perceived" temperature can be tuned by selecting an appropriate ferroelectric material to obtain the desired response and/or by choosing an appropriate electrical bias to be applied to an existing ferroelectric array.

In some embodiments, the polarization of the ferroelectric material can also be changed through the injection of free carriers (electrons and/or holes) into one or more of the IR emitters or into an area of the IR emission device adjacent to the IR emitters. See U.S. Pat. Nos. 9,195,052; 9,244,268; and 9,274,532, supra, and U.S. Patent Application Publication No. 2016/0103341, supra. Such polarization changes can be implemented in ferroelectric and piezoelectric crystals (e.g. AlN) and may be induced through electrical, mechanical or thermal stimuli as well.

This change in polarization of the ferroelectric material enables the IR emission frequency of the nanoscale array to be shifted spectrally as shown in FIG. 8C, where the initial resonance curve 810a is spectrally shifted to the position illustrated by curve 810b through the application of a compressive strain via an applied bias to the ferroelectric coating or nano-scale structure, while the application of a tensile strain would induce a spectral shift in the opposite direction. This spectral shift is transient, and is maintained only as long as the strain is applied. Therefore, if the strain is applied for short timescales, for instance sub-microseconds, a frequency modulated thermal source can be realized. If such a thermal source can be made to have an apparent temperature similar to that of the local background it would only be observed if someone demodulates the signal at the correct modulation frequency.

In other embodiments, use of phase change materials such as vanadium dioxide ($VO_2$), vanadium pentoxide ($V_2O_5$), germanium-antimony-tellurium (GeSbTe), or tungsten trioxide ($WO_3$), offers another avenue towards drastically changing the infrared reflection by the application of a thermal, electrical, or optical pulse. FIGS. 9A and 9B illustrate exemplary aspects of IR emission devices in accordance with the present invention in which such phase change materials are used to tune the device and produce a desired IR emission response.

Thus, as with the previous embodiments described above, in the exemplary embodiment illustrated in FIGS. 9A and 9B, an IR emission device in accordance with the present invention includes an array 900 of individual nanoscale IR emitters (TE) 901 arranged on a substrate 903, with an intermediate dielectric membrane 902 disposed between the substrate 903 and the emitter array. As with the embodiments described above, the emitters 901 are coupled to a heater 904 that is configured to provide heat to one or more of the emitter arrays on a given device when an electrical bias is applied to the heater contacts 905.

In the embodiment illustrated in FIG. 9A, each of the IR emitters 901 in the array comprises an IR emitter core 901a formed from a polaritonic material such as silicon carbide that is coated with an intermediate layer of a dielectric material 901b and an outer layer 901c of a phase change material such as vanadium oxide (VO$_2$), vanadium pentoxide (V$_2$O$_5$), germanium-antimony-tellurium (GeSbTe), or tungsten trioxide (WO$_3$). Intermediate layer 901b can thermally isolate the phase change and polaritonic materials so that they can be held at different temperatures; however, the device can also operate without the presence of this intermediate layer, with the phase change and polaritonic materials operating at the same temperature.

In addition, some phase change materials such as vanadium dioxide (VO$_2$) or vanadium pentoxide (V$_2$O$_5$) are also polar dielectric materials capable of supporting SPhPs, so that in some embodiments, as shown in FIG. 9B, the phase change material can be used to form the IR emitters 901 themselves rather than merely be used as a coating.

In either case, the IR emitters can be heated by heater 904 to provide an IR emission in a manner described above, where the IR emission can be used as a narrow-band infrared source or beacon or may cause the array of emitters to have a different "perceived" temperature than that of the underlying substrate or local environment.

In addition, the phase change material changes properties when the IR emitters are heated. For example, vanadium oxide changes from a dielectric i.e., electrically transparent, state to a metallic, i.e., reflective state. This change in state can also be induced in some embodiments by driving a small current through the phase change material, e.g., through electrical contacts 905, while in other embodiments it can be induced by the use of fast optical laser pulses applied to the phase change material.

Thus, as illustrated by the plot in FIG. 9D, in one state, where the IR emitters are at a temperature T above the critical temperature (T>T$_c$), the phase change material has "metallic" properties and becomes highly reflective and/or absorptive depending on the magnitude of the imaginary part of the permittivity of the PCM in the metallic state, such that IR emission from the underlying nano-scale structure is suppressed. In such cases, the IR emission from the devices will be dominated by the IR emission of the metallic phase change material. If the material is a high quality metal, with low loss, it will be highly reflective with minimal to no IR emission, whereas if it is a poor, lossy metal, it will act as a gray-body and provide a broad IR emission, dictated by its own emissivity, rather than by the underlying polaritonic nano-scale structure array.

In a second state, where the IR emitters are at a temperature T less than some critical temperature T$_c$ (T<T$_c$), the phase change material has "dielectric" properties, i.e., is transparent or only weakly absorbing, therefore enabling the IR emission from the underlying nano-scale structures to be transmitted and thus, observed. In such a case, the IR emission will be dictated by the underlying polaritonic nano-scale structure emissivity, and thus will provide the narrow-band, potentially polarized IR emission signature described above.

This change from "metallic" to "dielectric" states is ideal for amplitude modulation. Thus, as illustrated in the plot shown in FIG. 9C, an IR emission device according to this embodiment of the present invention can be turned "on" and "off" at a rapid rate, or can be induced to vary in amplitude to intermediate values depending on the device design and the properties of the phase change and polaritonic materials used. Such an approach can be quite useful for communications using infrared beacons since the device can be designed so that its emission(s) has an apparent temperature similar to their surroundings and will blend into the thermal background, but can be observed clearly if the observer demodulates the imaged scene at the appropriate frequency.

The metallic-to-dielectric phase change materials such as vanadium dioxide (VO$_2$) are a good candidate for this type of operation. The plot in FIG. 9D illustrates the optical response of a vanadium dioxide film grown by atomic-layer epitaxy and shows the change in reflectivity of the material depending on whether its temperature T is above or below a critical temperature T$_c$, i.e., that it can be in a low-reflectance dielectric state at T<T$_c$ and in a high-reflectance metallic state at T>T$_c$. Note that large contrasts in the infrared reflectivity can be achieved over a broad spectral range, making VO$_2$ a particularly suitable material for this embodiment. Of course, many other alternative phase change materials exist, and any suitable material may be used as appropriate.

Other aspects of phase change materials also make them highly suitable for use in IR emitters in accordance with the present invention. The phase change exhibited in the entire class of phase change materials is accompanied by a substantial contrast in refractive index. Large changes in the local refractive index can also be used to induce a spectral shift in the resonance frequency of the sub-diffractional resonator, therefore providing a mechanism towards frequency modulation as well, provided the phase change material still exhibits sufficient transmission at the wavelength of the IR emission in its metallic state. Phase change materials alternating between crystalline and non-metallic amorphous states would be good candidates for such approaches.

In addition, as with the ferroelectric materials described above, the polarization of such phase change materials can also be changed through the injection of free carriers (electrons and/or holes) into one or more of the IR emitters or into an area of the IR emission device adjacent to the IR emitters.

Moreover, in a manner similar to that described above with respect to emitters formed from ferroelectric materials, in some embodiments, all of the emitters are coated with or formed from the same phase change material, while in other embodiments, a subset of the emitters can be coated with or formed from a different phase change material so as to produce a spatially varying change in dielectric function, and thus a spatially varying IR emission pattern, e.g., one that can identify the owner of the IR emitters to a reader of the thermal signal. In still other embodiments, some of the plurality of emitters in the array can be formed from ferroelectric materials while others are formed from phase change materials, with their respective IR emission being tuned as described herein so as to provide a predetermined spatially varying IR emission pattern.

Figure 10B:
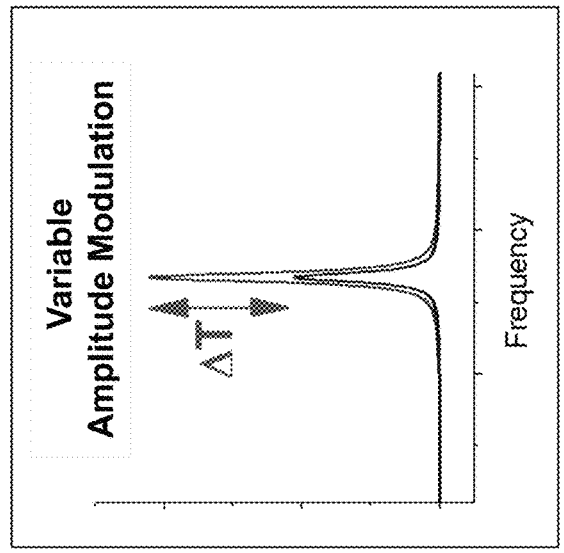
FIGS. 10A-10B are block schematics illustrating aspects of a polaritonic IR emitter incorporating phase change materials into one or more nano-scale structure arrays in accordance with the present disclosure.
Figure 10A:
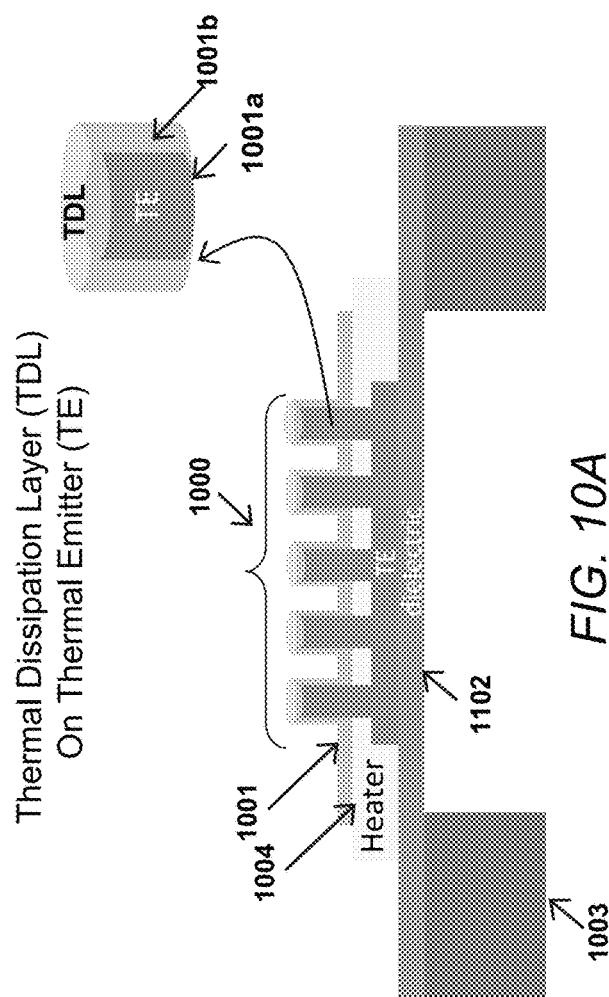

In other embodiments, aspects of which are illustrated in FIGS. 10A and 10B, the polaritonic IR emitters can be coated with a thermal dissipation layer. In such embodiments, the thermal dissipation layer can serve to conduct the heat rapidly away from the emitting material, therefore "shutting off" the IR emission or spectrally tuning the emission energy. Many of these emitters (e.g. SiC) also exhibit high thermal conductivities, so will naturally lend themselves to faster thermal cycling.

Thus, as illustrated in FIG. 10A, an IR emission device in accordance with this embodiment of the present invention includes an array 1000 of polaritonic nanoscale IR emitters (TE) 1001 arranged on a substrate 1003, with an intermediate dielectric membrane 1002 disposed between the substrate 1003 and the emitter array. As with the embodiments described above, the emitters 1001 are coupled to a heater

1004 that is configured to provide heat to one or more of the arrays of emitters on the device.

In addition, in the embodiment illustrated in FIG. 10A, at least some of the IR emitters 1001 in the array have an IR emitter core 1001a formed from a polaritonic material that is coated with an outer thermal dissipation layer 1001b of a thermal dissipation material. By overcoating the emitters with a high thermal conductivity layer 1001b, applied heat used to induce the IR emission can be rapidly dissipated, thereby lowering the temperature of the IR emitter nano-scale structure 1001a, which in turn will reduce the amplitude of the IR emission.

In some embodiments, the emitters can be formed from a ferroelectric material or from a phase change material as described above with respect to FIGS. 8B and 9B, respectively, with the emitters then coated with the thermal dissipation layer 1001b.

In other embodiments, the thermal dissipation layer can be placed as the underlying dielectric spacer layer 1002 or can be in the form of a via created through the backside of the substrate 1003.

Such TDL-based IR emitters provide an ideal approach for amplitude modulation. Thus, an IR emission device according to this embodiment of the present invention can be turned "on" and "off" at a rate as described above in the case of emitters and/or coatings made from phase change materials, or, as illustrated in the plot shown in FIG. 10B, can be induced to vary in amplitude to intermediate values depending on the device design and the temperature of the IR emitter at any given time. As the IR emitter can be controlled by understanding the interplay between the thermal dissipation rate of the TDL and the heat applied to the IR emitter array, this can serve as a means to modulate the amplitude of the IR emission signature. Such an approach can be quite useful for simple signaling with infrared beacons as it can be designed to have an apparent temperature similar to its surroundings and so be hidden in the thermal background, but can be observed clearly if the observer demodulates the imaged scene at the appropriate frequency.

One exemplary TDL material that can be incorporated into an IR emitter in accordance with this embodiment of the present invention would be nanocrystalline diamond (NCD), but any other suitable material can be used. Alternatively, as in the embodiments described above with respect to ferroelectric and phase change materials, in some embodiments of an IR emitter having a TDL layer incorporated therein, the nano-scale structures can be formed from a high thermal conductivity material, for instance SiC, which can simultaneously serve as both the IR emitter and the TDL.

While the above device implementations have focused on resonant IR emitters, these modulation approaches can also be used to modulate the throughput of an optical signal within a waveguide fabricated from a polaritonic material. In such cases, the propagation length and subdiffractional confinement of polaritonic waveguides is directly tied to the permittivity of the polaritonic material. By inducing a local strain through the use of a waveguide fabricated from a polaritonic ferroelectric material or from phase change material or a polaritonic waveguide coated with a ferroelectric or phase change material, the permittivity of the waveguide material can be modified, thus providing again a means for modulating the transmitted and/or reflected optical signal.

Advantages and New Features

The devices outlined in this disclosure would serve to provide a spectrally narrow, polarized light source that is also semi-diffuse, low-power, light-weight, with minimal electronic and mechanical components that could induce failure, potentially low-cost and can be amplitude and/or frequency modulated. This provides the benefits of both wide-viewing angles and long battery life, visibility over long ranges, while also providing spectral and polarization specific behavior with frequency and/or amplitude modulation of the response that can enable covert operation and/or modulated optical sources for beacons or optical communications devices. The divergence of the source can in principle also be tailored by modifying the periodicity of the nano-scale structure array, the shape of the nano-scale structures, or incorporation of dispersive elements/optics with those structures.

One could envision a large area (mm to cm size scale) single array that could be used to provide a spectral signature that could be superimposed upon either the IR emission of a broad band infrared source or the IR emission from the background to hide the signal in plain sight. Another alternative would be to fabricate a series of thermally isolated IR emitter arrays that could be individually addressed. This approach would also provide the benefits of the single array design, while also providing the opportunity to create unique spatial patterns that could be more readily discerned with imaging technology, albeit with the additional cost of the more complicated fabrication. Another possible alternative is to use these sources in conjunction with chemical sensors or as Surface Enhanced Raman or Surface Enhanced Infrared Absorption sensors themselves that can emit the covert pattern only when a change of status occurs (e.g. detection of chemical species of interest). Furthermore, these emitters can provide narrow-band sources of a defined frequency and polarization that can operate over a broad spectral range where solid-state narrowband sources (LEDs and laser diodes) are currently limited or completely absent (MWIR to THz).

These emitters can potentially provide a low-power, low-cost, polarized IR source where commercial sources are not currently available ($\lambda$>13 um) and/or for gas-phase sensing.

The modulated signal could be used for many potential signaling or communications applications. For example, an array of nanoscale IR emitters in accordance with the present invention can be arranged in a predetermined pattern to provide an identifying signal that is visible only to someone having appropriate imaging and filtering equipment. In other embodiments, the modulated emission(s) source could be used to identify sensors that have had a change of status (e.g. a chemical sensor detecting a dangerous gas) or to perform chemical spectral analysis. Or in another embodiment, the devices could be worn or held by personnel and be used for communications or to identify the personnel as being of a specific origin or belonging to an authorized organization.

They could also serve as an alternative, modulated, solid-state infrared light source with narrow spectral band, polarized emission whereby depending on the polaritonic material chosen (e.g. plasmonic or phonon polariton species) the emission wavelength could be designed anywhere from the near-infrared (e.g. highly doped transparent conducting oxides), into the MWIR (e.g. dysprosium doped cadmium oxide) into the LWIR (e.g. silicon carbide and III-Nitrides) and FIR (e.g. phosphide-, antimonide-, arsenide- and telluride-based semiconductors).

Figure 4:
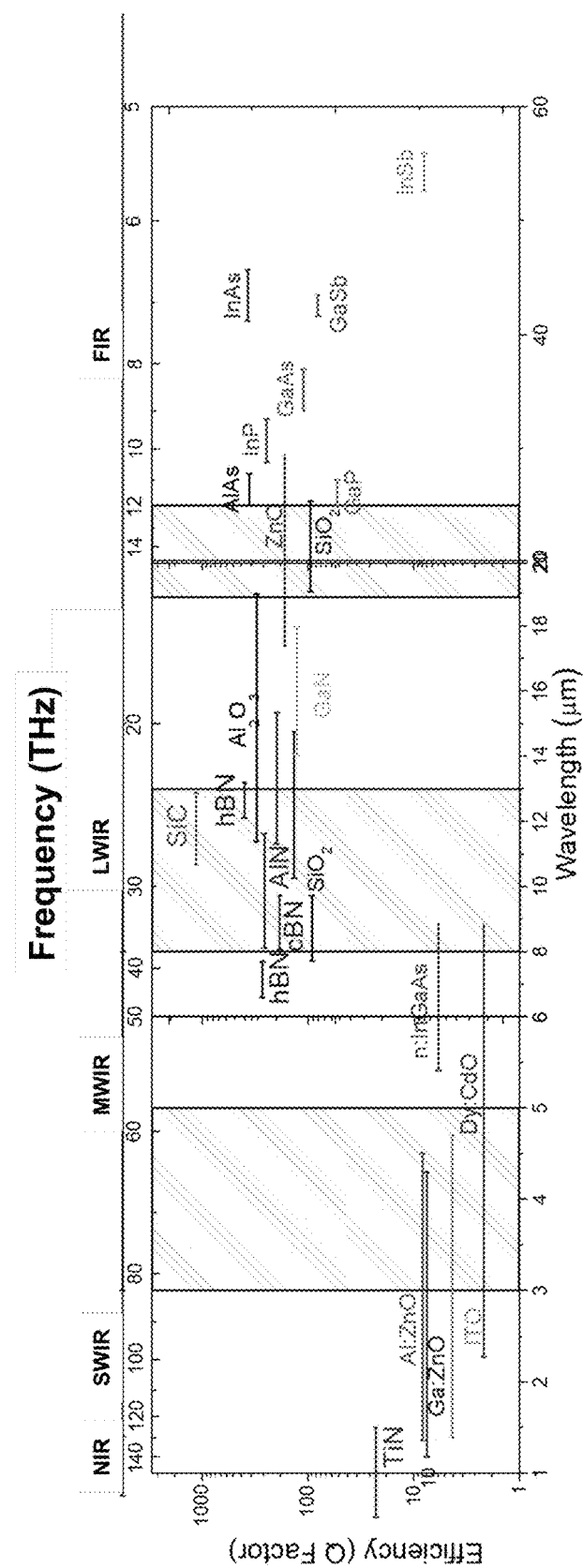
FIG. 4 is a chart illustrating the ranges of resonant frequencies for surface plasmon (NIR to MWIR) and surface phonon (MWIR to FIR) polariton materials that may be suitable for use in an IR emitter in accordance with the present disclosure.
Figures 5A, 5B:
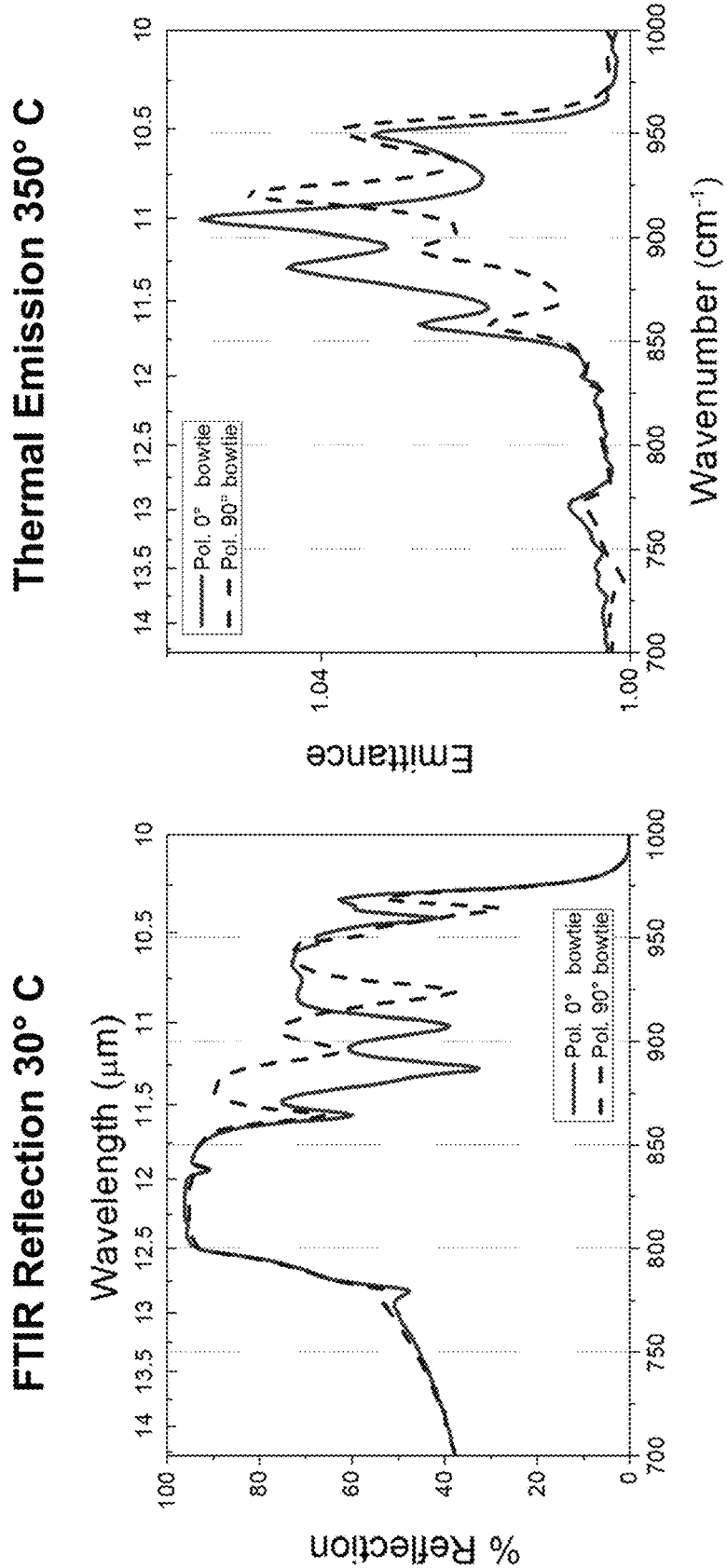
FIGS. 5A and 5B are plots illustrating the reflectance (FIG. 5A) and IR emission spectra (FIG. 5B) of antenna arrays formed from SiC bowtie nano-scale emitters in accordance with the prior art.

Finally, these emitters are also strong absorbers of light on resonance, and highly reflective off-resonance and therefore can be used as a passive device that when illuminated by an external light source or by the thermal energy of the local environment can provide a similar narrow-band and polarized response, but in this case could be covert even in areas where minimal background emission is anticipated. These and other applications derived from these modulated IR emitters also benefit from the atmospheric windows (e.g. the 3-5 and 8-12 μm windows, denoted by gray cross-hatched regions in FIG. 4), whereby light with these wavelengths can be transmitted over long distances with minimal absorption or scattering of light within the atmosphere.

Alternatives

Many additional uses in both the military and commercials spheres could be realized from this invention. Such modulated thermal sources could be used for molecular sensing, as the basis for free space communications, as on-chip sources for infrared nanophotonic devices or lab-on-a-chip approaches or for spectroscopy.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. An infrared (IR) emission device, comprising:
a substrate;
a plurality of fabricated nano-scale polaritonic material structures arranged on a first thermal dissipation layer disposed between the substrate and the polaritonic material structures, the polaritonic material structures comprising at least one ferroelectric material;
an electrical power source configured to induce a strain in the ferroelectric material; and
a heater configured to apply heat to at least one of the polaritonic material structures;
wherein the heater comprises a layer of a conductive metal having a thickness less than an optical absorption depth of the conductive metal;
wherein heat from the heater causes the at least one polaritonic material structure to produce an IR emission; and
wherein a predetermined wavelength, a predetermined linewidth, or a predetermined amplitude of the IR emission from the at least one polaritonic material structure can be obtained by an application of a predetermined electrical bias from the electrical power source to the ferroelectric material.

2. The IR emission device according to claim 1, wherein the at least one polaritonic material structure comprises a polaritonic core having a ferroelectric material coating thereon.

3. The IR emission device according to claim 2, wherein the polaritonic core is silicon carbide (SiC) and the ferroelectric material coating is aluminum nitride (AlN).

4. The IR emission device according to claim 1, wherein the at least one polaritonic material structure comprises a polaritonic ferroelectric material.

5. The IR emission device according to claim 4, wherein the polaritonic ferroelectric material is AlN or barium strontanate.

6. The IR emission device according to claim 4, wherein at least some of the polaritonic material structures are coated with a second thermal dissipation layer.

7. The IR emission device according to claim 1, wherein the array of fabricated nano-scale polaritonic material structures comprises an array of silicon carbide bowtie nanoantennas.

8. The IR emission device according to claim 1, wherein the heater comprises $Nb_2N$, TiN, or $Ta_2N$.

9. An infrared (IR) emission device, comprising:
a substrate;
a plurality of fabricated nano-scale polaritonic material structures arranged on a first thermal dissipation layer disposed between the substrate and the polaritonic material structures, the polaritonic material structures comprising at least one phase change material; and
a heater configured to apply heat to at least one of the polaritonic material structures;
wherein the heater comprises a layer of a conductive metal having a thickness less than an optical absorption depth of the conductive metal;
wherein heat from the heater causes the at least one polaritonic material structure to produce an IR emission; and
wherein a predetermined wavelength, a predetermined linewidth, or a predetermined amplitude of the IR emission from the at least one polaritonic material structure can be obtained by changing the local dielectric function of the phase change material in a predetermined manner.

10. The IR emission device according to claim 9, wherein the local dielectric function of the phase change material is changed by a predetermined heating of at least one of the polaritonic material structures.

11. The IR emission device according to claim 9, wherein the local dielectric function of the phase change material is changed by a predetermined laser excitation of at least one of the polaritonic material structures.

12. The IR emission device according to claim 9, further comprising a voltage source configured to apply an electrical bias to the at least one of the phase change material structures;
wherein the local dielectric function of the phase change material is changed by an application of a predetermined voltage bias to the phase change material.

13. The IR emission device according to claim 9, wherein the at least one polaritonic material structure comprises a polaritonic core having a phase change material coating thereon.

14. The IR emission device according to claim 13, wherein the polaritonic core is silicon carbide (SiC) and the phase change material is vanadium oxide ($VO_2$), vanadium pentoxide ($V_2O_5$), germanium-antimony-tellurium (GeSbTe), or tungsten trioxide ($WO_3$).

15. The IR emission device according to claim 9, wherein the at least one polaritonic material structure comprises a polaritonic phase change material.

16. The IR emission device according to claim 15, wherein the polaritonic phase change material is vanadium dioxide ($VO_2$) or vanadium pentoxide ($V_2O_5$).

17. The IR emission device according to claim 15, wherein at least some of the polaritonic material structures are coated with a second thermal dissipation layer.

18. The IR emission device according to claim 9, wherein the array of fabricated nano-scale polaritonic material structures comprises an array of silicon carbide bowtie nanoantennas.

19. The IR emission device according to claim 9, wherein the heater comprises $Nb_2N$, TiN, or $Ta_2N$.

20. An infrared (IR) emission device, comprising:
a substrate;
a plurality of fabricated nano-scale polaritonic material structures arranged on a first thermal dissipation layer disposed between the substrate and the polaritonic material structures, at least some of the polaritonic material structures being coated with a second thermal dissipation layer; and
a heater configured to apply heat to at least one of the polaritonic material structures;
wherein the heater comprises a layer of a conductive metal having a thickness less than an optical absorption depth of the conductive metal;
wherein heat from the heater causes the at least one polaritonic material structure to produce an IR emission; and
wherein a predetermined amplitude, a predetermined wavelength, or a predetermined linewidth of the IR emission from the at least one polaritonic material structure can be obtained by selectively applying heat to and removing heat from the at least one polaritonic material structure.

21. The IR emission device according to claim 20, wherein the first or second thermal dissipation layer is nanodiamond or boron arsenide.

22. The IR emission device according to claim 20, wherein the heater comprises $Nb_2N$, TiN, or $Ta_2N$.

23. An infrared (IR) emission device, comprising:
a substrate;
a plurality of fabricated polaritonic material structures arranged on a thermal dissipation layer disposed between the substrate and the polaritonic material structures; and
a heater configured to apply heat to at least one of the polaritonic material structures
wherein the heater comprises a layer of a conductive metal having a thickness less than an optical absorption depth of the conductive metal;
wherein heat from the heater causes the at least one polaritonic material structure to produce an IR emission; and
wherein at least one of a predetermined amplitude, a predetermined wavelength, and a predetermined linewidth of the IR emission can be obtained by selectively applying heat to and removing heat from the at least one polaritonic material structure.

24. The IR emission device according to claim 23, wherein the thermal dissipation layer is nanodiamond or boron arsenide.

25. The IR emission device according to claim 23, wherein the heater comprises $Nb_2N$, TiN, or $Ta_2N$.

26. An infrared (IR) emission device, comprising:
a substrate;
a first plurality of fabricated nano-scale first polaritonic material structures arranged on a first thermal dissipation layer disposed between the substrate and the first polaritonic material structures, the first polaritonic material structures comprising at least one ferroelectric material; and
a second plurality of fabricated nano-scale second polaritonic material structures arranged on a second thermal dissipation layer disposed between the substrate and the second polaritonic material structures, the second polaritonic material structures comprising at least one phase change material;
an electrical power source configured to induce a strain in the ferroelectric material; and
a heater configured to apply heat to at least one of the first and second polaritonic material structures;
wherein the heater comprises a layer of a conductive metal having a thickness less than an optical absorption depth of the conductive metal;
wherein heat from the heater causes the at least one polaritonic material structure to produce an IR emission; and
wherein a predetermined spatially varying wavelength, a linewidth, or amplitude of the IR emission can be obtained by an application of a predetermined electrical bias from the electrical power source to a predetermined plurality of the first and/or second polaritonic material structures.

27. The IR emission device according to claim 26, further wherein the wavelength, linewidth, or amplitude of the second polaritonic material structures is changed by a predetermined heating of the second polaritonic material structures.

28. The IR emission device according to claim 26, wherein the wavelength, linewidth, or amplitude of the second polaritonic material structures is changed by a predetermined laser excitation of at least one of the polaritonic material structures.

* * * * *